United States Patent
Shi et al.

(10) Patent No.: US 6,699,595 B2
(45) Date of Patent: Mar. 2, 2004

(54) ELECTROLUMINESCENT DEVICE WITH POLYPHENYL HYDROCARBON HOLE TRANSPORT LAYER

(75) Inventors: Jianmin Shi, Webster, NY (US); Shiying Zheng, Rochester, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 17 days.

(21) Appl. No.: 09/843,391

(22) Filed: Apr. 26, 2001

(65) Prior Publication Data

US 2001/0021478 A1 Sep. 13, 2001

Related U.S. Application Data

(62) Division of application No. 09/208,313, filed on Dec. 9, 1998, now abandoned.

(51) Int. Cl.$^7$ .............................................. H05B 33/12
(52) U.S. Cl. ........................ 428/690; 428/917; 313/504; 313/506
(58) Field of Search ................................ 428/690, 917; 313/504, 506; 257/40

(56) References Cited

U.S. PATENT DOCUMENTS

| | | | |
|---|---|---|---|
| 3,172,882 A | 3/1965 | Gurnee et al. | |
| 3,173,050 A | 3/1965 | Gurnee | |
| 3,710,167 A | 1/1973 | Dresner et al. | |
| 4,356,429 A | 10/1982 | Tang | 313/503 |
| 4,539,507 A | 9/1985 | VanSlyke et al. | 313/504 |
| 4,769,292 A | 9/1988 | Tang et al. | 428/690 |
| 5,061,569 A | 10/1991 | VanSlyke et al. | 428/457 |
| 5,141,671 A | 8/1992 | Bryan et al. | 252/301.16 |
| 5,366,811 A | 11/1994 | Higashi et al. | 428/457 |
| 5,554,450 A | 9/1996 | Shi et al. | 428/690 |
| 5,776,622 A | 7/1998 | Hung et al. | 428/690 |
| 5,840,217 A * | 11/1998 | Lupo et al. | 252/583 |
| 5,885,368 A * | 3/1999 | Lupo et al. | 136/263 |
| 5,989,737 A * | 11/1999 | Xie et al. | 428/690 |
| 6,361,886 B2 * | 3/2002 | Shi et al. | 428/690 |

FOREIGN PATENT DOCUMENTS

EP    0 676 461 A2    * 10/1995

OTHER PUBLICATIONS

Dresner, Double Injection Electroluminescence in Anthracene, RCA Laboratories, Jun. 1969, pp. 322–334.

* cited by examiner

*Primary Examiner*—Marie Yamnitzky
(74) *Attorney, Agent, or Firm*—Raymond L. Owens (57) ABSTRACT

An organic multilayer electroluminescent device including an anode and cathode, and comprising therebetween:

a hole transport layer; and an electron transport layer disposed in operative relationship with the hole transport layer;

wherein:

the hole transport layer includes an organic compound having the formula:

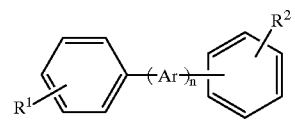

wherein:

Ar is an aryl moiety;

n is an integer of from 1 to 6; and substituents $R^1$ and $R^2$ are each individually hydrogen, or alkyl of from 1 to 24 carbon atoms; aryl or substituted aryl of from 5 to 28 carbon atoms; or heteroaryl or substituted heteroaryl of from 5 to 28 carbon atoms; or fluorine, chlorine, bromine; or cyano group.

1 Claim, 2 Drawing Sheets

FIG. 3

ELECTROLUMINESCENT DEVICE WITH POLYPHENYL HYDROCARBON HOLE TRANSPORT LAYER

CROSS REFERENCE TO RELATED APPLICATIONS

This is a divisional of U.S. patent application Ser. No. 09/208,313, filed Dec. 9, 1998, now abandoned. Reference is made to commonly-assigned U.S. patent application Ser. No. 09/207,703 filed Dec. 9, 1998, now U.S. Pat. No. 6,361,886, entitled "Electroluminescent Device Improved Hole Transport Layer" by Shi et al; U.S. patent application Ser. No. 09/208,172 filed Dec. 9, 1998, now U.S. Pat. No. 6,465,115, entitled "Electroluminescent Device with Anthracene Derivatives Hole Transport Layer" by Shi et al; U.S. patent application Ser. No. 09/208,071 filed Dec. 9, 1998, now abandoned, entitled "Electroluminescent Device with Arylethylene Derivatives in Hole Transport Layer" by Shi et al; and U.S. patent application Ser. No. 09/191,705 filed Nov. 13, 1998, now abandoned, entitled "A Multistructured Electrode For Use With Electroluminescent Devices" by Hung et al, the disclosures of which are incorporated herein.

FIELD OF THE INVENTION

The present invention relates to organic electroluminescent devices.

BACKGROUND OF THE INVENTION

Organic electroluminescent devices are a class of optoelectronic devices where light emission is produced in response to an electrical current through the device. (For brevity, EL, the common acronym for electroluminescent, is sometimes substituted.) The term organic light emitting diode or OLED is also commonly used to describe an organic EL device where the current-voltage behavior is non-linear, meaning that the current through the EL device is dependent on the polarity of the voltage applied to the EL device. In this embodiment, the term EL and EL devices will include devices described as OLED.

Organic EL devices generally have a layered structure with an organic luminescent medium sandwiched between an anode and a cathode. The organic luminescent medium usually refers to an organic light emitting material or a mixture thereof in the form of a thin amorphous or crystalline film. Representatives of earlier organic EL devices are Gurnee et al U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322–334, 1969; and Dresner U.S. Pat. No. 3,710,167, issued Jan. 9, 1973. In these prior arts, the organic luminescent medium was formed of a conjugated organic host material and a conjugated organic activating agent having condensed benzene rings. Naphthalene, anthracene, phenanthrene, pyrene, benzopyrene, chrysene, picene, carbazole, fluorene, biphenyl, terpheyls, quarterphenyls, triphenylene oxide, dihalobiphenyl, trans-stilbene, and 1,4-diphenylbutadiene were offered as examples of organic host materials. Anthracene, tetracene, and pentacene were named as examples of activating agents. The organic luminescent medium was present as a single layer having a thickness much above 1 micrometer. The voltage required to drive the EL devices was as much as a few hundreds volts, thus the luminous efficiency of these EL devices was rather low.

In commonly-assigned U.S. Pat. No. 4,356,429, Tang further advanced the art of organic EL device by disclosing a bi-layer EL device configuration. The organic luminescent medium in this bi-layer configuration comprises of two extremely thin layers of organic film (<1.0 micrometer in combined thickness) sandwiched between the anode and cathode. The layer adjacent to the anode, termed the hole-transport layer, is specifically chosen to transport predominantly holes only in the EL device. Likewise, the layer adjacent to the cathode is specifically chosen to transport predominantly electrons only in the EL device. The interface or junction between the hole-transport layer and the electron-transport layer is referred to as the electron-hole recombination zone where the electron and hole recombine to produce electroluminescence with least interference from the electrodes. This recombination zone can be extended beyond the interface region to include portions of the hole-transport layer or the electron-transport layer or both. The extremely thin organic luminescent medium offers reduced electrical resistance, permitting higher current densities for a given voltage applied on the EL device. Since the EL intensity is directly proportional to the current density through the EL device, this thin bi-layer construction of the organic luminescent medium allows the EL device to be operated with a voltage as low as a few volts, in contrast to the earlier EL devices. Thus, the bi-layer organic EL device has achieved a high luminous efficiency in terms of EL output per electrical power input and is therefore useful for applications such as flat-panel displays and lighting.

Commonly-assigned Tang U.S. Pat. No. 4,356,429 disclosed an EL device formed of an organic luminescent medium includes a hole transport layer containing a 1000 Angstrom of a porphyrinic compound such as copper phthalocyanine, and an electron transport layer of 1000 Angstrom tetraphenylbutadiene in poly(styrene). The anode was formed of a conductive indium-tin-oxide (ITO) glass and the cathode was a layer of silver. The EL device emitted blue light when biased at 20 volts at an average current density in the 30 to 40 mA/cm$^2$ range. The brightness of the device was 5 cd/m$^2$.

Further improvements in the bi-layer organic EL devices were taught by commonly-assigned Van Slyke et al U.S. Pat. No. 4,539,507. Van Slyke et al realized dramatic improvements in EL luminous efficiency by substituting the porphyrinic compounds of Tang in the hole-transport layer with an amine compound. With an aromatic tertiary amine such as 1,1-bis(4-di p-tolylaminophenyl)cyclohexane as the hole-transport layer and an electron transport layer of 4,4'-bis(5,7-di-t-pentyl-2-benzoxazolyl)-stilbene, the EL device was capable of emitting blue-green light with a quantum efficiency of about 1.2% photon per injected charge when biased at about 20 volts.

The use of aromatic amines as the material for the hole-transport layer in organic EL devices has since been generally recognized as numerous prior arts have disclosed the utility of various classes of amines in enhancing the EL device performance. Improvements in the hole-transport material parameters include higher hole transport mobility, more amorphous structures, higher glass transition temperature, and better electrochemical stability. Improvements in the organic EL devices with these improved amines include higher luminous efficiency, longer operational and storage life, and a greater thermal tolerance. For example, the improved arylamine hole transport materials have been disclosed in commonly-assigned U.S. Pat. No. 5,061,569 by VanSlyke et al. A series of aromatic amines with glass transition temperature as high as 165° C. designed for high temperature EL devices has been disclosed in commonly-assigned U.S. Pat. No. 5,554,450 by Shi et al. A novel

π-conjugated starburst molecule 4,4',4"-tris(3-methylphenylamino)triphenylamine (m-MTDATA), which forms a stable amorphous glass and functions as an excellent hole transport material, was disclosed in U.S. Pat. No. 5,374,489 by Shirota et al.

The use of organic compounds outside the aromatic amines class for the hole-transport layer in organic EL devices is not common, given the well-known hole-transport properties of the aromatic amines. However, there is a significant disadvantage of using aromatic amines as the hole-transport layer in the bi-layer EL device. Because amines are generally strong electron donors, they can interact with the emissive materials used in the electron-transport layer, resulting in the formation of fluorescence quenching centers and a reduction in the EL luminous efficiency.

SUMMARY OF THE INVENTION

It is an object of the present invention to provide organic compounds outside the class of aromatic amines as the hole transport layer in organic EL devices, which result in enhanced EL performance.

This object is achieved in an organic multilayer electroluminescent device including an anode and cathode, and comprising therebetween:
 a hole transport layer; and
 an electron transport layer disposed in operative relationship with the hole transport layer;
 wherein:
  the hole transport layer includes an organic compound having the formula:

wherein:
  Ar is an aryl moiety;
  n is an integer of from 1 to 6, and
  substituents $R^1$ and $R^2$ are each individually hydrogen, or alkyl of from 1 to 24 carbon atoms; aryl or substituted aryl of from 5 to 28 carbon atoms; or heteroaryl or substituted heteroaryl of from 5 to 28 carbon atoms; or fluorine, chlorine, bromine; or cyano group.

Polyphenyl hydrocarbon that are used in the hole transporting layer have the feature that do not need to include alkylamino- or arylamino-moieties;

The polyphenyl hydrocarbon or fused polyphenyl hydrocarbon in accordance with the present invention have an ionization potential larger than 5.0 eV.

The hole transport layer in accordance with the present invention effectively works with the electron transport layer or an emissive layer or an electron transport layer which also functions as an emissive layer to provide a highly efficient electroluminescent device.

DETAILED DESCRIPTION OF THE PREFERRED EMBODIMENTS

Figure 1:
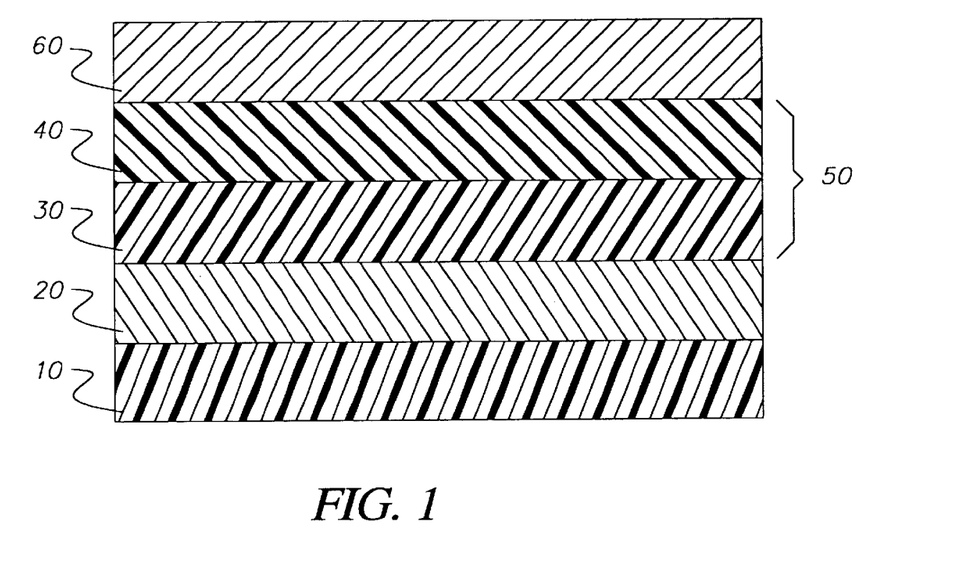
FIG. 1 illustrates the cross-section of a bi-layer organic EL device.

FIG. 1 illustrates the basic structure used in the construction of organic EL device of this invention. It is a bi-layer structure comprising an organic hole transport layer 30 and an organic electron transport layer 40. The electron transport layer is also the emissive layer from which electroluminescence originates. Together, they form the organic EL medium 50. The anode 20 is adjacent to the hole transport layer and the cathode 60 is adjacent to the electrode transport layer. The substrate is layer 10. This figure is for illustration only and the individual layer thickness is not scaled according to the actual thickness.

Figure 2:
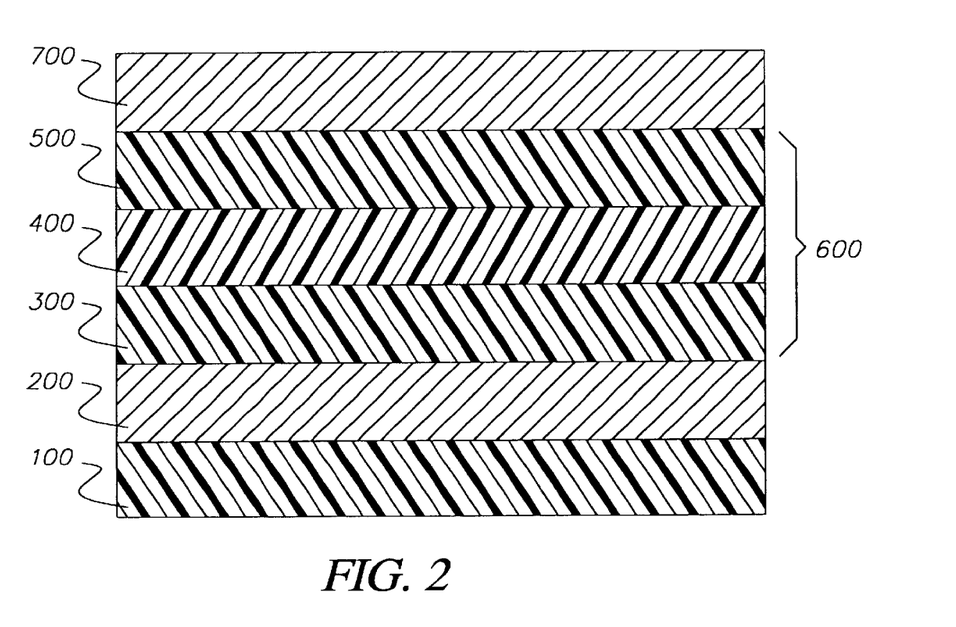
FIG. 2 illustrates the cross-section of an EL device with a modified bi-layer structure.

FIG. 2 illustrates an alternative construction of the organic EL device of this invention. It is a modified bi-layer structure. The EL medium contains an emissive layer between the hole transport layer and the electron transport layer. This emissive layer is the layer from which electroluminescence originates. Thus, layer 300 is the hole transport layer, layer 400 is the emissive layer, layer 500 is the electron transport layer, and together they form the electroluminescent medium 600. Layer 200 is the anode and layer 700 is the cathode. The substrate is layer 100. This figure is for illustration only and the individual layer thickness is not scaled according to the actual thickness.

Figure 3:
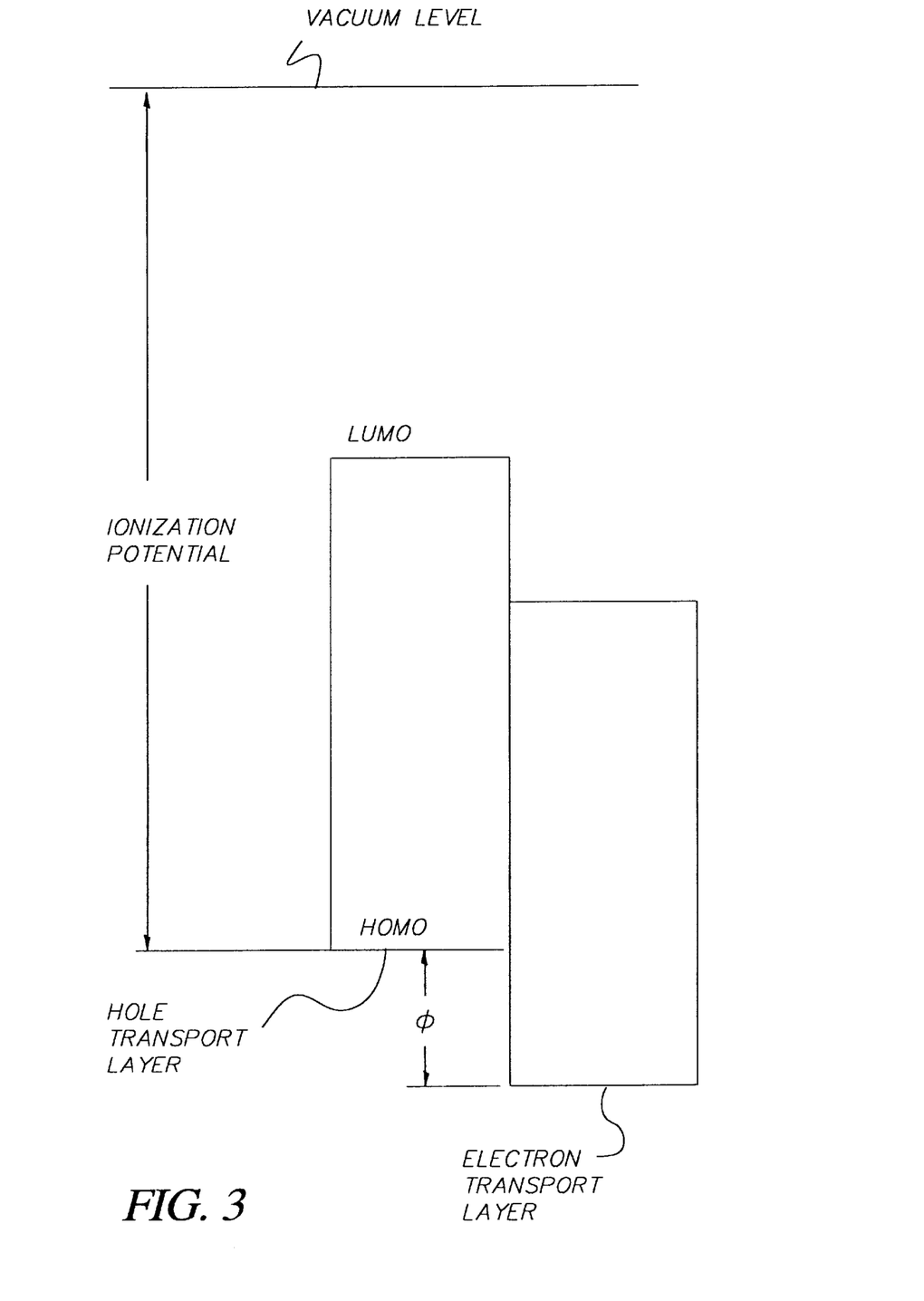
FIG. 3 illustrates the energy level diagram of an organic EL device with a bi-layer structure as described in FIG. 1.

FIG. 3 illustrates the energy level diagram of an organic EL device with a bi-layer structure as described in FIG. 1. The organic EL medium is represented by a hole-transport layer with a characteristic low ionization potential energy, and an electron transport layer with a relatively higher ionization potential energy. The ionization potential energy or ionization potential (IP) for a molecular solid is defined as the energy difference between the vacuum level and the highest occupied molecular orbital (HOMO) level of the solid. The vacuum level is usually referred to as the reference level from which the energy levels of the molecular solid are measured. The HOMO is the highest energy level filled with electron and in which the hole is free to move. Similarly, the lowest unoccupied molecular orbital (LUMO) is the lowest energy level devoid of electron and in which free electron is free to move. The energy difference between HOMO and LUMO is the bandgap within which there are no available molecular orbital states. The IP value is a measure of the minimum energy required to remove an electron from the molecular solid and can be easily obtained experimentally by photoemission techniques which have been well described in the literature.

The bi-layer structure as illustrated in FIG. 1 is designed to confine the electron hole recombination at the interface between the hole transport layer and the electron transport layer. This confinement is accomplished by establishing either an electron injection barrier or a hole injection barrier or both at the interface. Referring to the hole injection barrier, it is the difference between the HOMO levels of the hole transport and electron transport layers, as indicated by the symbol, φ, in FIG. 3. For large φ values, >0.5 eV, the hole migrating through the hole transport layer towards the interface will be unable to overcome the potential energy barrier and will thus be trapped at the hole transport layer side of the interface. Likewise, the electron injection barrier is the difference between the LUMO levels and a large electron injection barrier for electron injection will localize the electron at the electron transport layer side of the interface. As a result of these charge localizations created by a proper choice of the hole transport and electron transport materials, the electron hole pair will tend to recombine at the interface producing electroluminescence which is characteristics of the interface.

Conventional hole transport materials used in EL devices are mostly arylamines because their hole mobility is among the highest found in common organic materials. Materials with a high mobility are desirable for current-driven devices such as organic EL as the voltage require to operate the device will be low. The arylamines are also known to have the lowest ionization potentials among organic materials. Thus, for creating a hole injection barrier between the hole transport layer and the electron transport layer in a bi-layer EL device, arylamines are appropriate. Highly efficient EL devices have been produced using a variety of arylamines as the hole transport layer.

A class of arylamines found particularly useful in organic EL devices is represented by formula II:

II wherein
 Ar is an arylene group, and arylene moieties are phenyl or phenylene moieties.
 n is an integer of from 1 to 4, and
 $R^1$, $R^2$, $R^3$ and $R^4$ are independently selected aryl groups.
These arylamines are particularly useful as the hole transport material in EL devices.

Compound 1

Compound 2

Compound 3

Compound 4

Although arylamines are useful as hole transport materials in EL devices, they do have a number of deficiencies. First, as a class of organic materials, they are relatively strong electron donors, meaning that they can be easily oxidized and therefore are unstable in amibient environments. Second, when used as a hole transport layer adjacent to an electron transport layer in an EL device, the arylamines may interact with the electron transport layer to produce non-emissive centers which will result in a loss of electroluminescence. Third, because of the low ionization potential of the arylamines, the hole injection barrier formed between the arylamine hole transport layer and the electron transport layer will cause the holes to localize in the arylamines which will also result in a loss of electroluminescence. For these reasons, new hole transport materials are useful to further improve the EL device performance.

The new hole transport materials in this invention include polyphenyl hydrocarbons with a molecular structure containing at least 20 carbon atoms;

A representative class of the hole transport materials includes:

a) benzene linked polyphenyl hydrocarbons of formula III:

III wherein:

n is integer from 1 to 6; and

Ar is a phenyl or substituted phenyl moiety; the substituents on the phenyl moiety are individually hydrogen, or alkyl of from 1 to 24 carbon atoms; aryl or substituted aryl of from 5 to 28 carbon atoms; heteroaryl or substituted heteroaryl of from 5 to 28 carbon atoms; fluorine, chlorine or bromine atoms; or a cyano group.

The following molecular structures constitute specific examples of benzene linked polyphenyl hydrocarbons represented by the general formula III. These compounds are particularly useful as the hole transport material in EL devices.

Compound 5

Compound 6

Compound 7

Compound 8

-continued

Compound 9

Compound 10

Compound 11

Compound 12

Compound 13

Compound 14

Compound 15

Compound 16

-continued

Compound 17, n = 0;
Compound 18, n = 1;
Compound 19, n = 2;
Compound 20, n = 3;
Compound 21, n = 4;

Compound 22, n = 0;
Compound 23, n = 1;
Compound 24, n = 2;
Compound 25, n = 3;
Compound 26, n = 4;

Compound 27, n = 0;
Compound 28, n = 1;
Compound 29, n = 2;
Compound 30, n = 3;
Compound 31, n = 4;

Compound 32, n = 0;
Compound 33, n = 1;
Compound 34, n = 2;
Compound 35, n = 3;
Compound 36, n = 4;

Compound 37, n = 0;
Compound 38, n = 1;
Compound 39, n = 2;
Compound 40, n = 3;
Compound 41, n = 4;

b) naphthalene linked polyphenyl hydrocarbons of formula IV:

IV wherein:
n is integer from 1 to 4;
Ar is a phenyl or substituted phenyl moiety; the substituents on the phenyl moiety are individually hydrogen, or alkyl of from 1 to 24 carbon atoms; aryl or substituted aryl of from 5 to 28 carbon atoms; heteroaryl or substituted heteroaryl of from 5 to 28 carbon atoms; fluorine, chlorine or bromine atoms; or a cyano group.

The following molecular structures constitute specific examples of naphthalene linked polyphenyl hydrocarbons represented by the general formula IV. These compounds are particularly useful as the hole transport material in EL devices.

Compound 42

Compound 43

Compound 44

Compound 45

Compound 46

Compound 47

Compound 48

Compound 49 c) phenanthrene linked polyphenyl hydrocarbons of formula V:

V wherein:
  Ar is a phenyl or substituted phenyl moiety; the substituents on the phenyl moiety are individually hydrogen, or alkyl of from 1 to 24 carbon atoms; aryl or substituted aryl of from 5 to 28 carbon atoms; heteroaryl or substituted heteroaryl of from 5 to 28 carbon atoms; fluorine, chlorine or bromine atoms; or a cyano group.

The following molecular structures constitute specific examples of phenanthrene linked polyphenyl hydrocarbons represented by the general formula V. These compounds are particularly useful as the hole transport material in EL devices.

Compound 50

Compound 51

Compound 52 c) fluorene linked polyphenyl hydrocarbons of formula VI:

VI wherein:
R is an alkyl group of from 1 to 12 carbon atoms; and
Ar is a phenyl or substituted phenyl moiety; the substituents on the phenyl moiety are individually hydrogen, or alkyl of from 1 to 24 carbon atoms; aryl or substituted aryl of from 5 to 28 carbon atoms; heteroaryl or substituted heteroaryl of from 5 to 28 carbon atoms; fluorine, chlorine or bromine atoms; or a cyano group.

The following molecular structures constitute specific examples of fluorene linked polyphenyl hydrocarbons represented by the general formula VI. These compounds are particularly useful as the hole transport material in EL devices.

Compound 53

Compound 54

Compound 55 e) spirophenyl linked polyphenyl hydrocarbons of formula VII, and VIII:

wherein:

Ar is a phenyl or substituted phenyl moiety; the substituents on the phenyl moiety are individually hydrogen, or alkyl of from 1 to 24 carbon atoms; aryl or substituted aryl of from 5 to 28 carbon atoms; heteroaryl or substituted heteroaryl of from 5 to 28 carbon atoms; fluorine, chlorine or bromine atoms; or a cyano group.

The following molecular structures constitute specific examples of spirophenyl linked polyphenyl hydrocarbons represented by the general formula VII, and VIII. These compounds are particularly useful as the hole transport material in EL devices.

Compound 56

Compound 57

Compound 58

Compound 59

-continued

Compound 60

In forming the hole transport layer of the organic EL device, the hole transport materials of this invention can be deposited by a number of methods. The preferred method is by vacuum vapor deposition as these aromatic hydrocarbons have good thermal stability and can be sublimed into thin film. Alternately, they can be dissolved in appropriate solvents and be cast into thin film. Other deposition methods such as printing by the inkjet method, thermal transfer, laser abrasion and sputtering are useful.

The bi-layer EL device is the basic structure providing high luminous efficiencies and low-voltage operation. Alternative EL device structures have been demonstrated providing improved device performance. These alternative device structures include features in addition to the basic bi-layer structure such as the following structure (a) hole injection layer as disclosed in U.S. Pat. No. 4,356,429; (b) cathode modification with alkaline or alkaline halides as disclosed in U.S. Pat. No. 5,776,622; (c) anode modification with plasma-deposited flurocarbons as disclosed in the above cited commonly assigned U.S. patent application Ser. No. 09/191,705 to Hung et al, now abandoned and (d) doped emitter layer inserted between the hole transport and electron transport layer as disclosed in U.S. Pat. No. 4,769,292. These EL device structures retain the hole transport layer as one component of the electroluminescent medium. Therefore, the aromatic hydrocarbon or fused hydrocarbon hole transport materials disclosed in this invention are applicable to these EL device structures as well.

A preferred EL device structure comprises an anode, a hole transport layer, an emissive layer, and an electron transport layer. In this preferred EL structure, the emissive layer is capable of transporting electrons as well, thus it can be considered as an electron transport layer with the added function of being highly luminescent. The principle function is to provide efficient emissive centers for electroluminescence. This emissive layer comprises a host material doped with one or more fluorescent dyes (FD). The fluorescent dye is usually present in an amount on the order of a few molar percent or less of the host material and it is sufficient to cause the EL emission to be predominantly that of the fluorescent dye. Using this method, highly efficient EL devices can be constructed. Simultaneously, the color of the EL devices can be tuned by using fluorescent dyes of different emission wavelengths. By using a mixture of fluorescent dyes, EL color characteristics of the combined spectra of the individual fluorescent dyes are produced. This dopant scheme has been described in considerable details for EL devices by Tang in commonly-assigned U.S. Pat. No. 4,769,292.

An important relationship for choosing a fluorescent dye as a dopant capable of modifying the hue of light emission when present in a host material is a comparison of their bandgap potential which is defined as the energy difference between the highest occupied molecular orbital and the lowest unoccupied molecular orbital of the molecule.

Preferred host materials for the emissive layer of the organic EL device disclosed in this invention are metal chelated oxinoid compounds, including chelates of oxine itself (also commonly referred to as 8-quinolinol or 8-hydroxyquinoline or Alq). Another class of preferred host materials is a mix ligand 8-quinolinolato aluminum chelates which have been disclosed in U.S. Pat. No. 5,141,671. Another class of preferred host materials is di-strylstibene derivatives as disclosed in U.S. Pat. No. 5,366,811.

For efficient energy transfer from the host to the dopant molecule, a necessary condition is that the band gap of the dopant is smaller than that of the host material. Preferred fluorescent dyes used as the dopant in the emissive layer include coumarins, stilbenes, distrylstilbenes, derivatives of anthracene, tetracene, perylenes, rhodamines, and arylamines.

The molecular structures of the preferred fluorescent dyes for the emissive layer in the EL device are listed as follows:

FD1

FD2

FD3

FD4

FD5

FD6 R = H
FD7 R = Me

FD8 X = O, $R^1 = R^2$ = Alkyl
FD9 X = S, $R^1 = R^2$ = Alkyl

FD10 R = Ph
FD11 R = Me
FD12 R = t-Bu
FD13 R = Mesityl

Preferred materials for use in forming the electron transporting layer of the organic EL device are metal chelated oxinoid compounds, including chelates of oxine itself (also commonly referred to as 8-quinolinol or 8-hydroxyquinoline). Representative compounds are 8-hydroquinoline of the group III metals such as Al, In, Mg; and of the group II metals such as Mg, Zn; and of the group I metal such as Li.

Preferred materials for use in forming the an anode modified with fluorocarbons as disclosed in the above disclosed commonly assigned U.S. patent application Ser. No. 09/191,705 by Hung et al., now abandoned.

Preferred materials for use in forming the cathode of the EL devices of this invention are Mg, Li, or alloys of these materials as disclosed in U.S. Pat. No. 5,429,884; and commonly-assigned U.S. Pat. No. 5,776,622 by Tang, Hung and others.

EXAMPLES

The invention and its advantages are further illustrated by the specific examples as follows:

Example 1

Synthesis of 2-naphthylene boronic acid

A solution of n-BuLi (1.6 M in hexane, 100 mL, 0.16 mol) was added via an addition funnel to 2-bromonaphthalene (30.0 g, 0.14 mol) in 200 mL of dry THF at −78° C. The yellow suspension was stirred at this temperature for a half hour, a solution of $B(OMe)_3$ (26.6 mL, 29.1 g, 0.28 mol) in 150 mL of dry THF was added dropwise, with the temperature kept below −60° C. The resulting colorless solution was allowed to warm to room temperature overnight, then 300 mL of 10 M HCl was added and the mixture stirred for a further one hour under nitrogen. Water and ether were added, and the aqueous layer was extracted several times with ether. The combined organic extracts were dried over MgSO4 and evaporated under reduced pressure to yield a white solid (21.0 g, 95%), which was used in the coupling reaction without further purification.

Example 2

Synthesis of 3,5-di-(m-tolyl)bromobenzene

To a solution of 1,3,5-tribromobenzene(47.3 g, 0.15 mol) in 150 mL of dry tetrahydrofuran (THF) was added 0.5 g of bis-(triphenylphosphine)-palladium(II) chloride under nitrogen. After the solution was degassed with dry nitrogen for 5 minutes, 155 mL of m-tolyl magnesium bromide (0.2 M in THF) was added through an addition funnel at 70° C. under nitrogen. The reaction mixture was stirred under reflux for another two hours after addition. After cooling the reaction mixture was quenched by slowly adding 50 mL of 0.5 N HCl with stirring. Then the solvents were removed via a rotary evaporator. The residue was dissolved in hexane and washed with 0.1 M HCl followed by water. After removing the solvent, the crude residue was purified by chromatography on silica gel using hexane as the eluent. After drying, 28.0 g of, 3,5-di-m-tolyl bromobenzene was collected. Yield 55.3%.

Example 3

Synthesis of 3,5-(1-naphthyl)bromobenzene

To a solution of 1,3,5-tribromobenzene (105.0 g, 0.22 mol) in 500 mL of dry tetrahydrofuran (THF) was added 1.0 g of bis-(triphenylphosphine)-palladium(II) chloride under nitrogen. After the solution was bubbled with dry nitrogen for 5 minutes, 1-naphthylmagnesium bromide, which was prepared from 150.0 g (0.48 mol) of 1-bromonaphthalene in 100.0 mL of dry THF and clean, dry 18.0 g of magnesium in 250 mL of dry THF with 1,2-dibromoethane as an initiator, was added through an addition funnel at 70° C. under nitrogen. The reaction mixture was stirred under reflux for another two hours. After the reaction mixture was cooled, it was quenched by slowly adding 25.0 mL of 5% HCl with stirring. Then the solvents were removed via a rotary evaporator. The residue was dissolved in dichloromethane and washed with 0.1 M HCl followed by water. After removal of solvents, the crude residue was purified by crystallizing from heptane. A 57.0 g of pure 3,5-di(1-naphthyl)bromobenzene was collected. Yield 63.5%.

Example 4

Synthesis of 1,2,4,5-tetra-p-biphenylylbenzene (Compound 10)

Dry Mg turnings (3.9 g, 0.16 mol) and 30 mL of anhydrous THF were added to a 1 L 3-necked round-bottomed flask equipped with a condenser, a nitrogen inlet, an additional funnel and a magnetic stirring bar. 4-Bromobiphenyl (37.2 g, 0.16 mol) was dissolved in 150 mL of THF and placed in an additional funnel. The reaction flask was placed in a 50° C. oil bath and one crystal of iodine was added. Once the reaction started 4-bromobiphenyl was added dropwise to the reaction. After addition, the brownish reaction was heated at reflux for another hour and then cooled to room temperature. A suspension of hexabromobenzene (11.0 g, 0.02 mol) in 150 mL of THF was added dropwise from an additional funnel to the reaction and the mixture was stirred at room temperature overnight. The reaction was quenched with ice and 8% hydrochloric acid and extracted with 400 mL of methylene chloride. The organic layer was washed with saturated sodium chloride solution and dried over magnesium sulfate. Solvent was evaporated and the crude product was washed with hexane and filtered to give pure product.

Example 5

Synthesis of 1,2,4,5-tetra-β'-naphthylbenzene (Compound 9)

The procedure used to synthesize compound 10 was followed.

Example 6

Synthesis of 1,2,4,5-tetra-6'-methoxy-β'-naphthylbenzene (Compound 11)

The procedure used to synthesize compound 10 was followed.

Example 7

Synthesis of 3,3''',5,5'''-tetra-α-naphthyl-p-terphenyl (Compound 28)

A solution of 3,5-di-α-naphthyl bromobenzene (10 g, 0.0244 mol) in anhydrous THF (70 mL) was added dropwise to magnesium turnings (0.59 g, 0.0244 mol) in 10 mL THF. The solution was heated at 60° C. during the addition and the reaction was initiated using 1,2-dibromoethane. After the addition was complete, the brown solution was heated at reflux for 2 hrs. and then cooled to room temperature. In a separate flask, 1,4-diiodobenzene (2.69 g 0.008 mol) and 0.3 g of dichlorobis(triphenyl phosphine)palladium(II) were placed under nitrogen and 30 mL of anhydrous THF was added. The Grignard reagent prepared about THF solution was then added using needle-transfer and an orange solution resulted. Heat was applied and the solution turned to almost black. The mixture was then heated at reflux for 45 min. and cooled to room temperature during which time a solid precipitated out of solution. A 2.0 M solution of HCl was added to the mixture and after stirring for 30 minutes, the aqueous layer was removed. The solid precipitate was collected by filtration and washed with water and diethyl ether to yield a white solid (4.9 g, 82%)

Example 8

Synthesis of 3,3'',5,5''-tetra-naphthyl-p-quaterphenyl (Compound 29)

A solution of 3,5-di-α-naphthyl bromobenzene (10.0 g, 0.0244 mol) in anhydrous THF (70 mL) was added dropwise to magnesium turnings (0.59 g, 0.0244 mol) in 10 mL THF. The solution was heated at 60° C. during the addition and the reaction was initiated using 1,2-dibromoethane. After the addition was complete, the brown solution was heated at reflux for 2 hrs. and then cooled to room temperature. In a separate flask, 4,4'-diiodobiphenyl (3.3 g 0.008 mol) and 0.3 g of dichlorobis(triphenyl phosphine)palladium(II) were placed under nitrogen and 30 mL of anhydrous THF was added. The Grignard reagent prepared about THF solution was then added using needle-transfer and an orange solution resulted. Heat was applied and the solution turned to almost black. The mixture was then heated at reflux for 45 min. and cooled to room temperature during which time a solid precipitated out of solution. A 2.0 M solution of HCl was added to the mixture and after stirring for 30 minutes, the water layer was removed. The solid precipitate was collected by filtration and washed with water and diethyl ether to yield a white solid (5.3 g, 81%)

Example 9

Synthesis of 2,7-biphenyl-9,9-bis(4-methoxyphenyl)-fluorene (Compound 53)

A solution of 4-brombiphenyl (10.43 g, 0.0448 mol) in anhydrous THF (90 mL) was added dropwise to magnesium turnings (1.09 g, 0.0448 mol) in 10 mL THF. The solution was heated at 60° C. during the addition and the reaction was initiated using 1,2-dibromoethane. After the addition was complete, the red solution was heated at reflux for 2 hrs. and then cooled to room temperature. In a separate flask, 2,7-dibromo-9,9-bis(4-methoxyphenyl)-fluorene (10 g, 0.0187 mol) and 0.65 g of dichlorobis(triphenyl phosphine) palladium(II) were placed under nitrogen and 100 mL of anhydrous THF was added. The Grignard reagent prepared about THF solution was then added using double-needle transfer and an orange solution resulted. Heat was applied and the solution turned a darker orange. The mixture was then heated at reflux for 2 hours during which time a yellow solid precipitated out of solution. A 2.0 M solution of HCl was added to the mixture and after stirring for 30 minutes, the aqueous layer was removed. The solid precipitate was collected by filtration and washed with water and diethyl ether to yield a yellow solid (10.5 g, 83%).

Example 10

Synthesis of 2,7-β-dinaphthyl-9,9-bis(4-methoxyphenyl)-fluorene (Compound 54)

2,7-Dibromo-9,9-bis(4-methoxyphenyl)-fluorene (10.0 g, 0.0187 mol), 2-naphthylboronic acid (7.7 g, 0.0448 mol), Tetrakis(triphenylphosphine)palladium(0) (1.0 g), 75 mL of Toluene and 30 mL of 2N $K_2CO_3$ were all placed into a round-bottom flask equipped with a stirring bar and a condenser. The mixture was stirred vigorously and heated at reflux overnight. After cooling to room temperature, the aqueous layer was removed and the solid precipitate was collected by filtration. The resulting solid was heated gently in a 2M HCl solution for 30 minutes and then collected once again by filtration and washed with water and diethyl ether. After drying, 9.17 g of 2,7-β-dinaphthyl-9,9-bis(4-methoxyphenyl)-fluorene was collected. Yield 78%.

The invention has been described in detail with particular reference to certain preferred embodiments thereof, but it will be understood that variations and modifications can be effected within the spirit and scope of the invention.

| PARTS LIST | |
|---|---|
| 10 | substrate |
| 20 | anode |
| 30 | hole transport layer |
| 40 | electron transport layer |
| 50 | organic EL medium |
| 60 | cathode |
| 100 | substrate |
| 200 | anode |
| 300 | hole transport layer |
| 400 | emissive layer |

| PARTS LIST-continued | |
|---|---|
| 500 | electron transport layer |
| 600 | EL medium |
| 700 | cathode |

What is claimed is:

1. An organic multilayer electroluminescent device including an anode and cathode, and comprising therebetween:

a hole transport layer;

an emissive layer; and an electron transport layer disposed in operative relationship with the hole transport layer; wherein:

the hole transport layer does not include an aromatic amine and includes an organic compound having the formula:

wherein:

Ar is a phenyl or substituted phenyl moiety or a naphthyl moiety, the substituents on said moiety are individually hydrogen, or alkyl of from 1 to 24 carbon atoms, aryl or substituted aryl of from 5 to 28 carbon atoms, heteroaryl or substituted heteroaryl of from 5 to 28 carbon atoms, fluorine, chlorine or bromine atoms, or a cyano group.

* * * * *